(12) United States Patent
Kim et al.

(10) Patent No.: US 7,900,176 B2
(45) Date of Patent: Mar. 1, 2011

(54) TRANSISTOR LAYOUT STRUCTURES FOR CONTROLLING SIZES OF TRANSISTORS WITHOUT CHANGING ACTIVE REGIONS, AND METHODS OF CONTROLLING THE SAME

(75) Inventors: Sung-Hoon Kim, Seongnam-si (KR); Joung-Yeal Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 550 days.

(21) Appl. No.: 12/000,056

(22) Filed: Dec. 7, 2007

(65) Prior Publication Data

US 2008/0141204 A1 Jun. 12, 2008

(30) Foreign Application Priority Data

Dec. 8, 2006 (KR) .................... 10-2006-0124259

(51) Int. Cl.
*G06F 17/50* (2006.01)
(52) U.S. Cl. .................. 716/122; 716/118; 716/119; 716/124
(58) Field of Classification Search ............ 716/5, 716/8–10, 118, 119, 122, 124
See application file for complete search history.

(56) References Cited

U.S. PATENT DOCUMENTS 7,052,962 B1 * 5/2006 Lovejoy .................. 438/264

2003/0173588 A1 * 9/2003 Bianchi .................. 257/200
2005/0001216 A1    1/2005 Adkisson et al.
2006/0138465 A1 * 6/2006 Choi et al. ............... 257/207

FOREIGN PATENT DOCUMENTS

| JP | 07-115178 | 5/1995 |
| JP | 2004-311824 | 11/2004 |
| JP | 2005-236210 | 9/2005 |
| KR | 10-1998-0013909 | 5/1998 |
| KR | 10-2001-0084292 | 9/2001 |
| KR | 10-2005-0002080 | 1/2005 |
| KR | 10-2005-0060179 | 6/2005 |

* cited by examiner

*Primary Examiner*—Vuthe Siek
(74) *Attorney, Agent, or Firm*—Harness, Dickey & Pierce, P.L.C.

(57) ABSTRACT

A structure for controlling the size of a transistor may include: an active region; a first gate line on the active region; one or more second gate lines on the active region; and source or drain regions arranged in three or more divided active regions that result from the first gate line and the one or more second gate lines dividing the active region into the divided active regions. A method of controlling the size of a transistor may include: arranging an active region; arranging a first gate line on the active region; arranging one or more second gate lines on the active region; arranging source or drain regions in three or more divided active regions; and controlling the size of the transistor by connecting to each other or separating from each other the source or drain regions using upper wires.

20 Claims, 9 Drawing Sheets

TRANSISTOR LAYOUT STRUCTURES FOR CONTROLLING SIZES OF TRANSISTORS WITHOUT CHANGING ACTIVE REGIONS, AND METHODS OF CONTROLLING THE SAME

PRIORITY STATEMENT

This application claims priority from Korean Patent Application No. 10-2006-0124259, filed on Dec. 8, 2006, in the Korean Intellectual Property Office (KIPO), the entire contents of which are incorporated herein by reference.

BACKGROUND

1. Field

Example embodiments relate to transistor layout structures for controlling the sizes of transistors and methods of controlling the same. Also, example embodiments relate to transistor layout structures for controlling the sizes of transistors, without changing an active region, in a metal wiring process and methods of controlling the sizes of the transistors.

2. Description of Related Art

In general, the size of a transistor is typically decided by the width W and length L of a channel that are the width and length of a zone forming the channel. The size of a transistor is related to the size of an active region. When the active region is big, the size of the transistor is big, and when the active region is small, the size of the transistor is small. That is, generally, the size of an active region is controlled to control the size of a transistor.

FIG. 1 is an equivalent circuit diagram of a conventional PMOS transistor, and FIG. 2 is a layout diagram of the transistor of FIG. 1.

As illustrated in FIG. 1, a general PMOS transistor P comprises a source/drain region B, a gate A, and a drain/source region C. The PMOS transistor has predetermined width W and length L of a channel.

Reference marks "B" and "C" do not directly indicate the drain and source region. These marks denote metal wires connected to the drain and source regions. Since FIG. 1 is an equivalent circuit diagram, the metal wires are identically illustrated.

The transistor of the equivalent circuit as illustrated in FIG. 1 has a conventional layout structure as illustrated in FIG. 2. As illustrated in FIG. 2, an active region ACT in a predetermined size is arranged on a semiconductor substrate. A gate line A across the active region ACT is arranged on the active region ACT. The active region ACT is divided into two by the gate line A, and the two divided regions are a source region and a drain region.

The width of the gate line A is a channel length L of the transistor, and the width of the active region ACT in a direction of the length of the gate line A is a channel width W of the transistor. Generally, the size of the transistor has been controlled by controlling the width of the gate line A and the width of the active region ACT. That is, transistor manufacturers have decided the size of the active region by design and have manufactured transistors in a desired size by realizing the size of the active region through the layout structure like FIG. 2.

However, when the size of a transistor is different by wrong design or defects during a transistor manufacturing process, a wafer which is subject to a manufacturing process is to be destroyed, and a new wafer needs to be again manufactured after the design is again made or the defects upon manufacture are corrected. Specifically, in FIG. 2, when the size of a transistor needs to be controlled after upper wires connected to each of the source/drain regions through a contact CT, i.e., the metal wires B and C, are formed, all of these should be abandoned and a layout is to be again designed, to manufacture a transistor. Therefore, the manufacturing cost increases and the efficiency of production decreases.

In this regard, a technique is needed to control the size and the like in a transistor in the manufacturing process. This is called a revision process. It is most favorable that the revision process is performed in the final step of the transistor manufacturing process. When the revision process is performed in the beginning step of the transistor manufacturing process, the transistors being in the processing steps in which the revision process cannot be performed in the processing steps following the beginning step should be abandoned. However, when the revision process is performed in the last step of the transistor manufacturing process, the transistors in all of the processing steps are usable.

Therefore, a layout designing technique is required to make it possible to perform the revision during the latter half of a manufacturing process.

SUMMARY

Example embodiments may provide transistor layout structures for controlling the size of one or more transistors and methods of controlling the size of the one or more transistors.

Example embodiments may provide transistor layout structures for controlling the size of one or more transistors in a step of manufacturing one or more upper wires, and methods of controlling the size of the one or more transistors.

Example embodiments may provide transistor layout structures for controlling the size of one or more transistors without changing the size of an active region, and methods of controlling the size of the one or more transistors.

Example embodiments may provide transistor layout structures for controlling the size of one or more transistors and methods of controlling the size of the one or more transistors that reduce manufacturing costs and/or improve the efficiency of production.

Example embodiments may provide transistor layout structures for controlling the size of one or more transistors by performing a simple revision process or processes, and methods of controlling the size of the one or more transistors.

According to example embodiments, a transistor layout structure for controlling a size of one or more transistors may include: an active region; a first gate line on the active region arranged substantially in a first direction; one or more second gate lines on the active region arranged to extend substantially in a second direction from the first gate line; and/or source or drain regions arranged in three or more of a plurality of divided active regions that result from the first gate line and the one or more second gate lines dividing the active region into the plurality of divided active regions. The second direction may be substantially perpendicular to the first direction.

According to example embodiments, a transistor layout structure for controlling a size of one or more transistors may include: an active region; and/or two or more gate lines on the active region in directions different from each other. The two or more gate lines may divide the active region into three or more divided active regions. A size of the one or more transistors may be controlled by connecting to each other or separating from each other the divided active regions using upper wires.

According to example embodiments, a method of controlling a size of one or more transistors may include: arranging an active region; arranging a first gate line on the active region substantially in a first direction; arranging one or more second gate lines on the active region to extend substantially in a second direction from the first gate line; arranging source or drain regions in three or more of a plurality of divided active regions that result from the first gate line and the one or more second gate lines dividing the active region into the plurality of divided active regions; and/or controlling the size of the one or more transistors by connecting to each other or separating from each other the source or drain regions using upper wires. The second direction may be substantially perpendicular to the first direction.

According to example embodiments, a method of controlling a size of one or more transistors may include: forming at least three or more transistors by dividing one active region into three or more regions; selecting at least two of the three or more regions in an upper wire forming step; and/or electrically connecting to each other or separating from each other the at least two selected regions.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
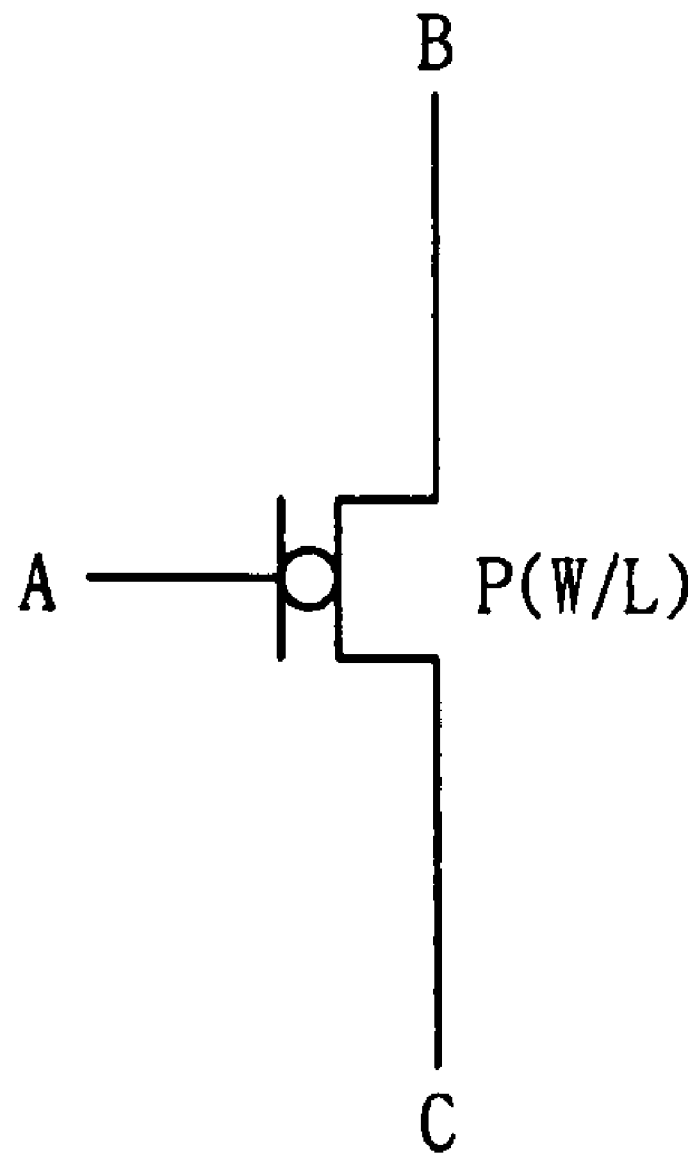
FIG. 1 is an equivalent circuit diagram of a conventional PMOS transistor.

Example embodiments will now be described more fully with reference to the accompanying drawings. Embodiments, however, may be embodied in many different forms and should not be construed as being limited to example embodiments set forth herein. Rather, these exemplary embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 3:
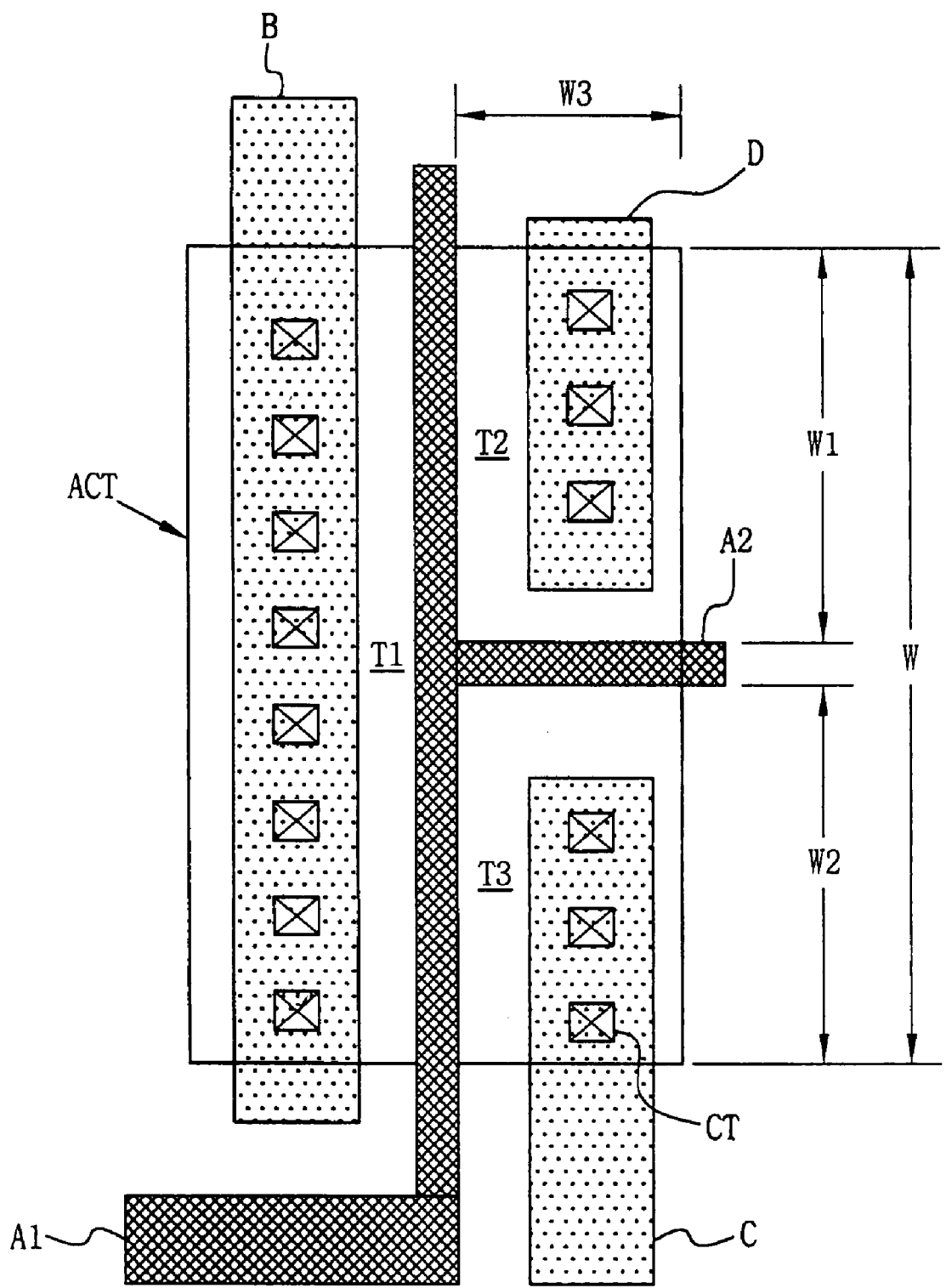
FIG. 3 is a transistor layout structure for controlling the size of one or more transistors according to example embodiments.
Figure 4:
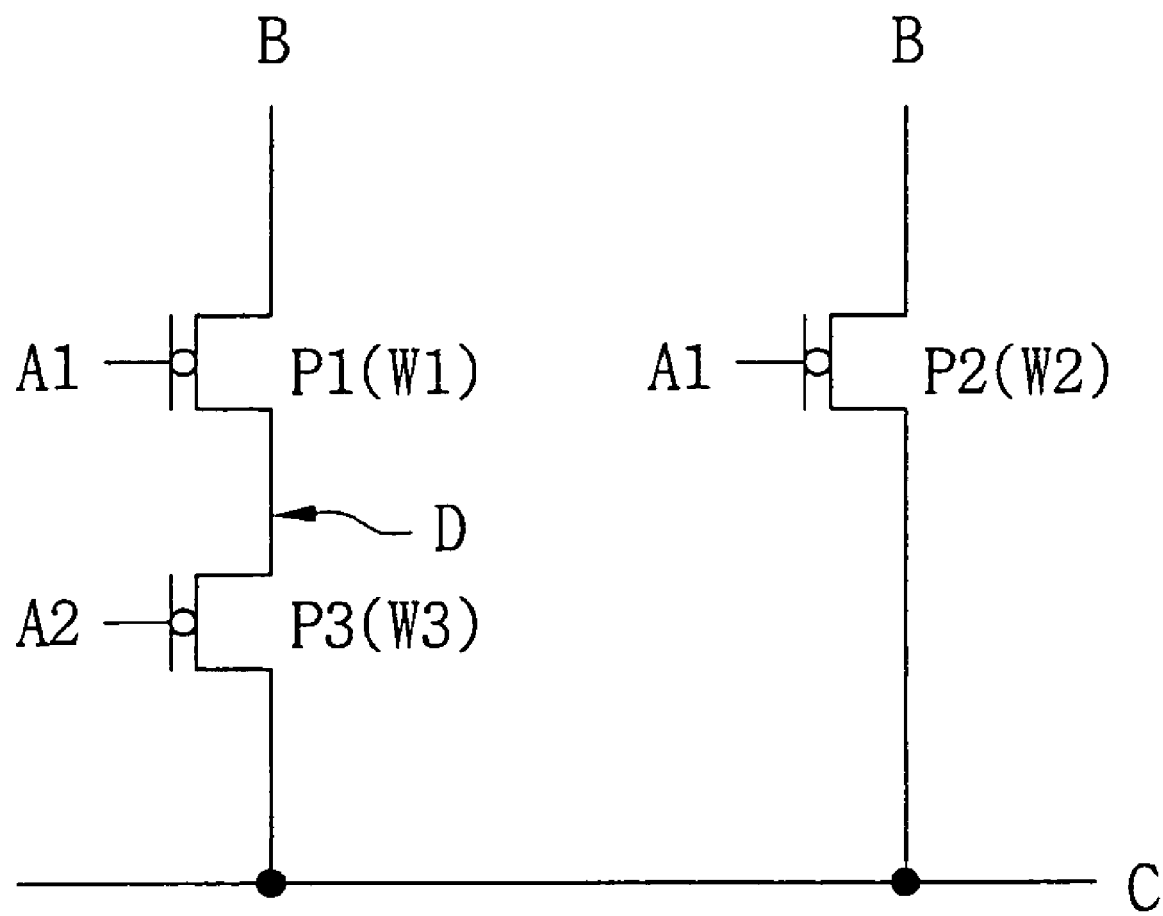
FIG. 4 is an equivalent circuit diagram of FIG. 3.

FIG. 3 is a transistor layout structure for controlling the size of one or more transistors according to example embodiments. FIG. 4 is an equivalent circuit diagram of FIG. 3.

As illustrated in FIG. 3, the transistor according to example embodiments may have a layout structure of an active region ACT, a first gate line A1, and/or a second gate line A2.

The active region ACT may be arranged with a size that may or may not be predetermined. The size of the active region ACT may be a little bigger than the generally defined size for a transistor in the desired size to be manufactured.

The first gate line A1, with a width that may or may not be predetermined, may be arranged on the active region ACT in a first direction. The first gate line A1 may extend across all or a portion of the active region ACT. The first gate line A1 may divide the active region ACT into two divided active regions.

The second gate line A2, with a width that may or may not be predetermined, may be arranged on the active region ACT in a second direction that is at an angle to the first direction. The first and second directions may be, for example, substantially perpendicular to each other.

The second gate line A2 may extend from a specific part of the first gate line A1 across a portion of the active region ACT. The second gate line A2 may divide one of the two divided active regions (divided by the first gate line A1) into two regions T2 and T3.

For example, the active region ACT may be divided into a first active region T1, a second active region T2, and/or a third active region T3 by the first gate line A1 and/or the second gate line A2.

Based on the above-described layout structure, three transistors P1, P2, and P3, that may or may not be different from one another in size, may be arranged in the active region ACT. The divided active regions T1, T2, and T3 may be common or independent source or drain regions in one or more of the transistors.

Among the three transistors P1, P2, and P3, the first transistor P1 may be arranged with the first divided active region T1 and the second divided active region T2 as source/drain regions, and/or with the first gate line A1 as a gate region. The channel width of the first transistor P1 may be 'W1', that may be the span of the second divided active region T2 in the first direction, and/or the channel length may be the width of the first gate line A1 and/or the distance across the first gate line A1 in the second direction.

Among the three transistors P1, P2, and P3, the second transistor P2 may be arranged with the first divided active region T1 and the third divided active region T3 as source/drain regions, and/or with the first gate line A1 as a gate region. The channel width of the second transistor P2 may be 'W2', that may be the span of the third divided active region T3 in the first direction, and/or the channel length may be the width of the first gate line A1 and/or the distance across the first gate line A1 in the second direction.

Among the three transistors P1, P2, and P3, the third transistor P3 may be arranged with the second divided active region T2 and the third divided active region T3 as source/drain regions, and/or with the second gate line A2 as a gate region. The channel width of the third transistor P3 may be 'W3', that may be the span of the second divided active region T2 or the third divided active region T3 in the second direction, and/or the channel length may be the width of the second gate line A2 and/or the distance across the second gate line A2 in the first direction. That is, the channel length of the third transistor P3 may be, for example, equal to 'W−(W1+W2)'.

Subsequently, the upper wires (for example, metal wires) B, D, and C, that may be respectively electrically connected to the divided active regions T1, T2, and T3 through one or more contacts CT, may be arranged. As one of the upper wires, the first upper wire B may be electrically connected, for example, to the first divided active region T1. Additionally or in the alternative, the first upper wire B may be electrically connected, for example, to a line of a source voltage VDD or a line for application of any control signal. Further, the second upper wire D may be electrically connected, for example, to the second divided active region T2 through the one or more contacts CT. The third upper wire C may be electrically connected, for example, to the third divided active region T3 through the one or more contacts CT. Additionally or in the alternative, the third upper wire C may be electrically connected, for example, to a ground line or a line for application of any control signal.

As illustrated in FIG. 4, the equivalent circuit diagram of the three transistors P1, P2, and P3, that are arranged according to the layout structure of FIG. 3, may be as discussed below.

The first transistor P1 and the third transistor P3 may be connected to each other, for example, in series between the first upper wire B and the third upper wire C. The second transistor P2 may be connected to the first transistor P1 and the third transistor P3, for example, in parallel between the first upper wire B and the third upper wire C. The channel width of a synthetic transistor in which the first transistor P1, the second transistor P2, and the third transistor P3 may be considered as one transistor may be, for example, equal to '(W1+W3)/2+W2'.

Figure 5:
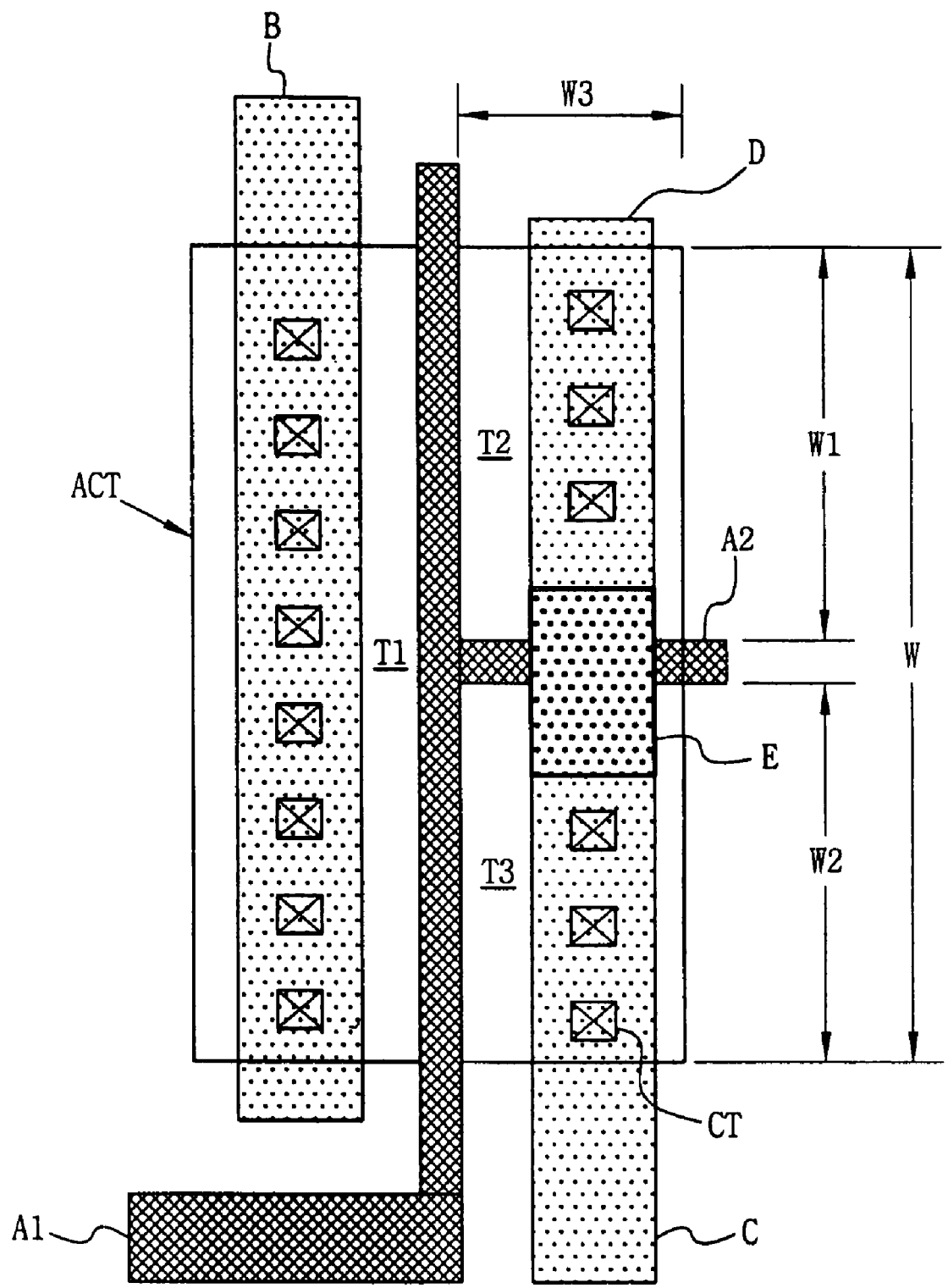
FIG. 5 is a layout diagram when a revision process is performed on the transistor layout structure of FIG. 3.
Figure 6:
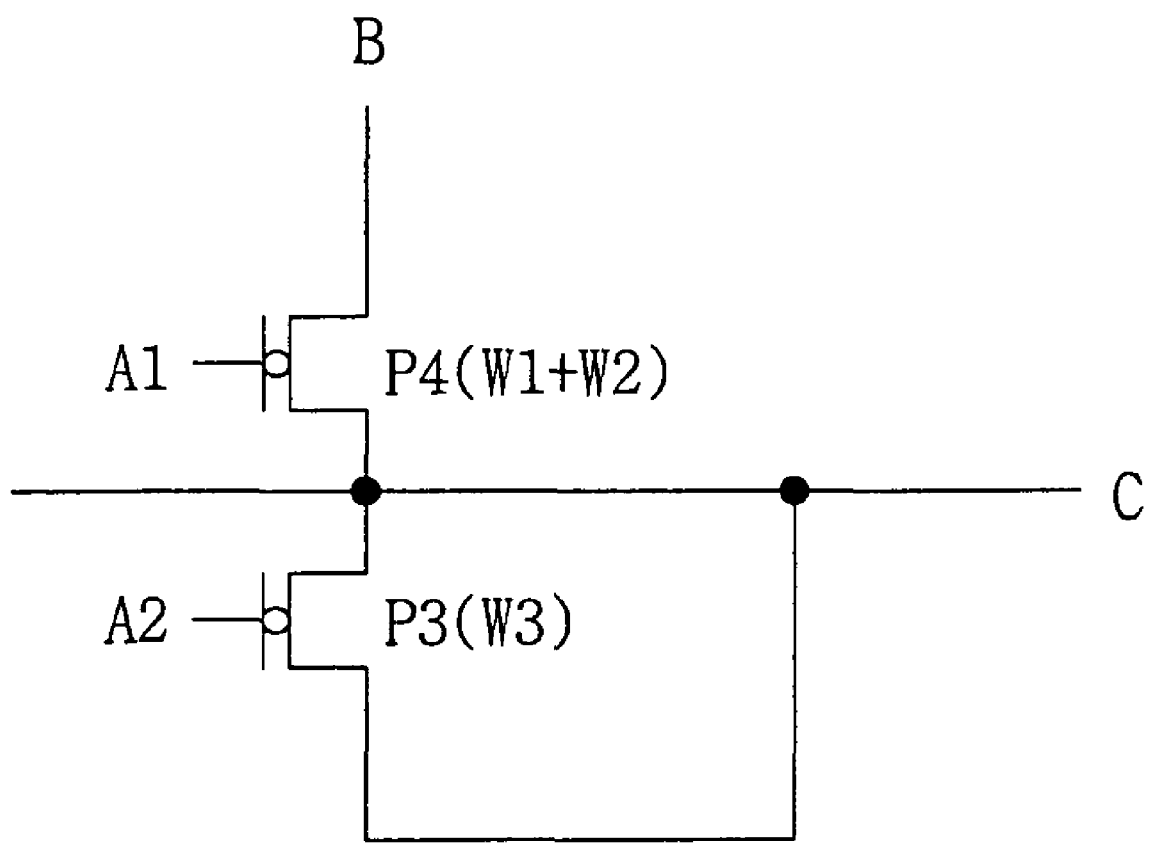
FIG. 6 is an equivalent circuit diagram of FIG. 5.

FIG. 5 is a layout diagram when a revision process is performed on the transistor layout structure of FIG. 3. FIG. 6 is an equivalent circuit diagram of FIG. 5.

FIG. 5 illustrates that transistors may be formed in the layout structure of FIG. 3 and the revision process may be performed in an upper wiring step of a metal wiring process.

The layout structure illustrated in FIG. 5 may be similar to or identical with the layout structure of FIG. 3 except, for example, for the layout structure of a fourth upper wire E, and thus no description of the layout structure will be presented.

The upper wires may be formed when the first transistor P1, the second transistor P2, and/or the third transistor P3 are formed and/or arranged. In this case, to form one transistor that is bigger in size, the second upper wire D may be electrically connected, for example, to the third upper wire C. That is, when the fourth upper wire E is used to cause a short between the second upper wire D and the third upper wire C, the second divided active region T2 and the third divided active region T3 may be connected to each other to form the one transistor that is bigger in size. To connect the second upper wire D and the third upper wire C to each other, a metal wiring process may be performed using a mask that is separately manufactured for the metal wiring process, in addition to or in the alternative to using the fourth upper wire E.

In this case, the equivalent circuit diagram may have the structure illustrated in FIG. 6.

As illustrated in FIG. 6, as the nodes D and C of FIG. 4 may be electrically connected to each other, and/or the first transistor P1 and the second transistor P2 may be connected to each other in parallel as a synthetic fourth transistor P4. Because the channel width of the fourth transistor P4 may have the value of 'W1+W2' (that is, the channel width W1 of the first transistor P1 plus the channel width W2 of the second transistor P2), the fourth transistor P4 may be bigger in size. The channel length of the fourth transistor P4 may be similar to or identical with that of the first transistor P1 or the second transistor P2.

As the second divided active region T2 and the third divided active region T3 are connected to each other by the fourth upper wire E, the source and drain regions may be shorted in the third transistor P3. Therefore, the third transistor P3 may lose the function of a transistor. In this case, the third transistor P3 may be re-used, for example, as a capacitor.

Figure 2:
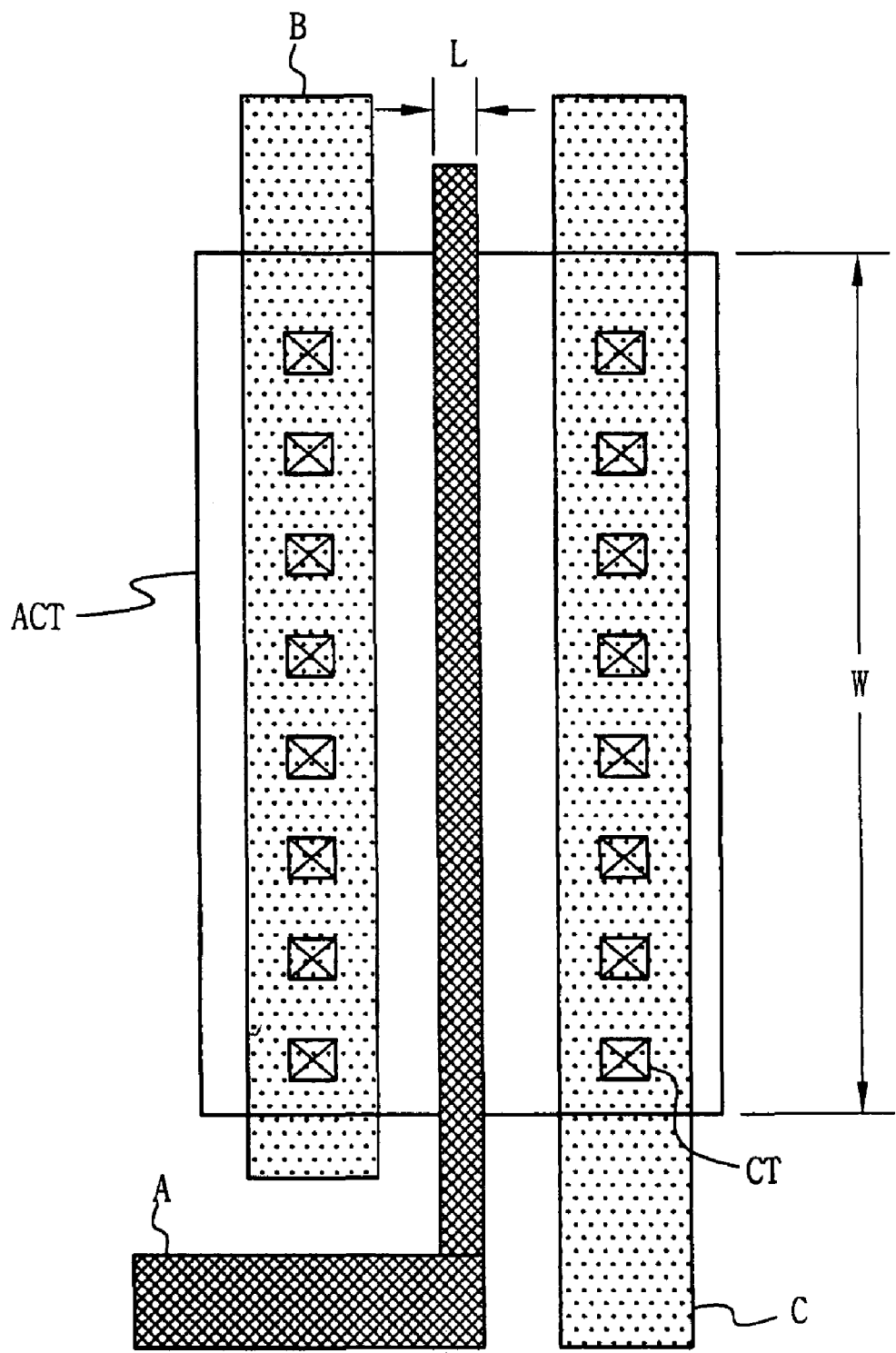
FIG. 2 is a layout diagram of the transistor of FIG. 1.

In this case, the channel width of the fourth transistor P4 may be reduced by 'W−(W1+W2)' compared to the conventional transistor illustrated in FIG. 2. However, to enable the channel width of the fourth transistor P4 of FIG. 6 to have the same channel width as the transistor of FIG. 2, it may be necessary to design the active region ACT to be slightly bigger at the beginning of the design process, in order to compensate the part for the amount by which the channel width decreases. Alternatively, the size of the fourth transistor P4 may be controlled by controlling the channel length, that may be the width of the first gate line A1 and/or the second gate line A2, at the time of making the design.

As another example, when the first upper wire B and the second upper wire D are connected to each other, the second transistor P2 and the third transistor P3 may be configured to be electrically connected to each other, for example, in parallel. Then, the channel width of the synthetic transistor may be, for example, equal to 'W2+W3'. In this case, 'W1', 'W2', and 'W3' may be controllable by controlling the position of the first gate line A1 and/or the second gate line A2 at the time of making the design. Therefore, it may be possible to form one or more transistors that are different in size at the revision step. Thus, it may be necessary to design the transistor that is most suitable and/or enables easy revision at the time of making the design.

Figure 7:
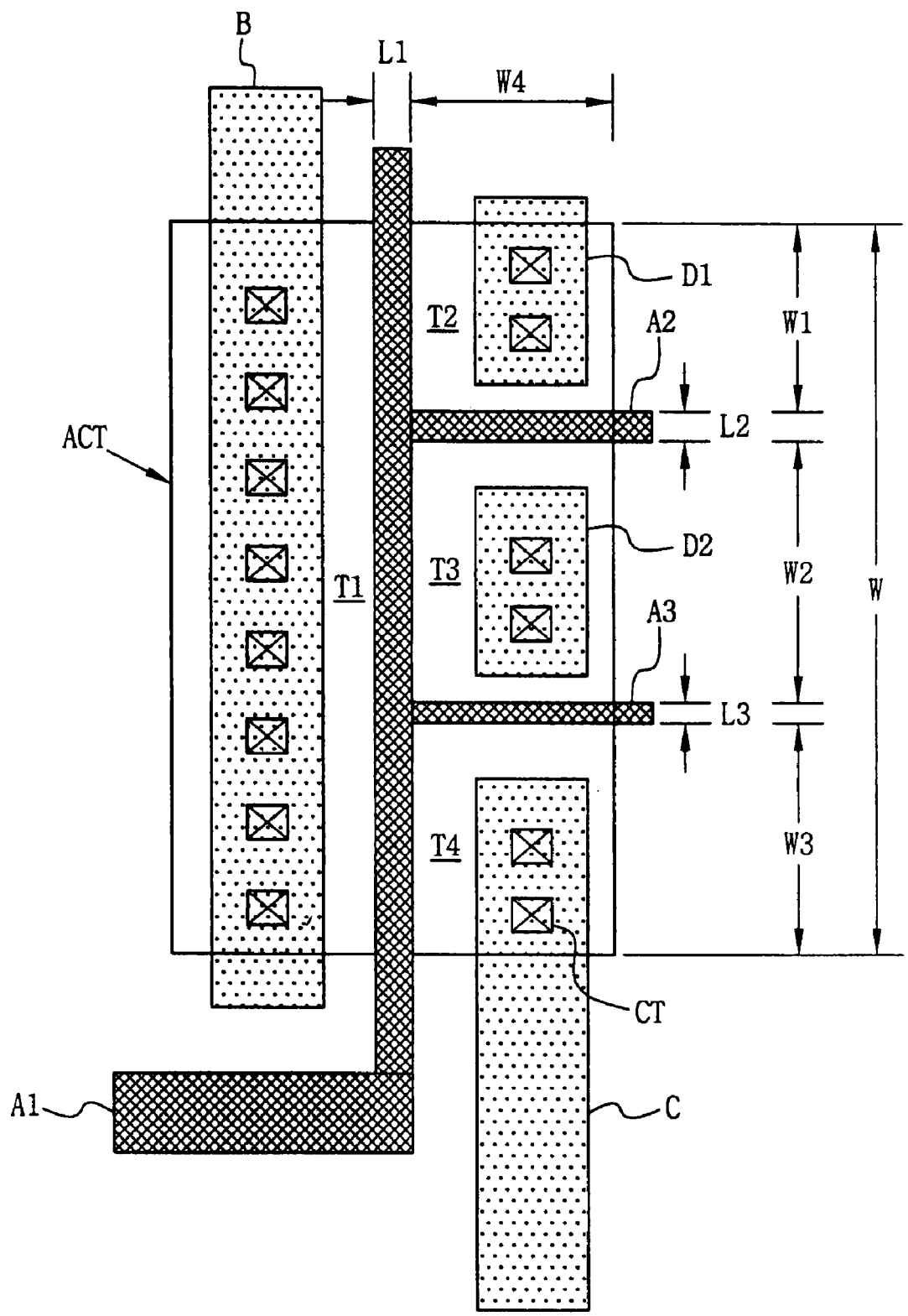
FIGS. 7 and 8 are transistor layout diagrams according to example embodiments.
Figure 8:
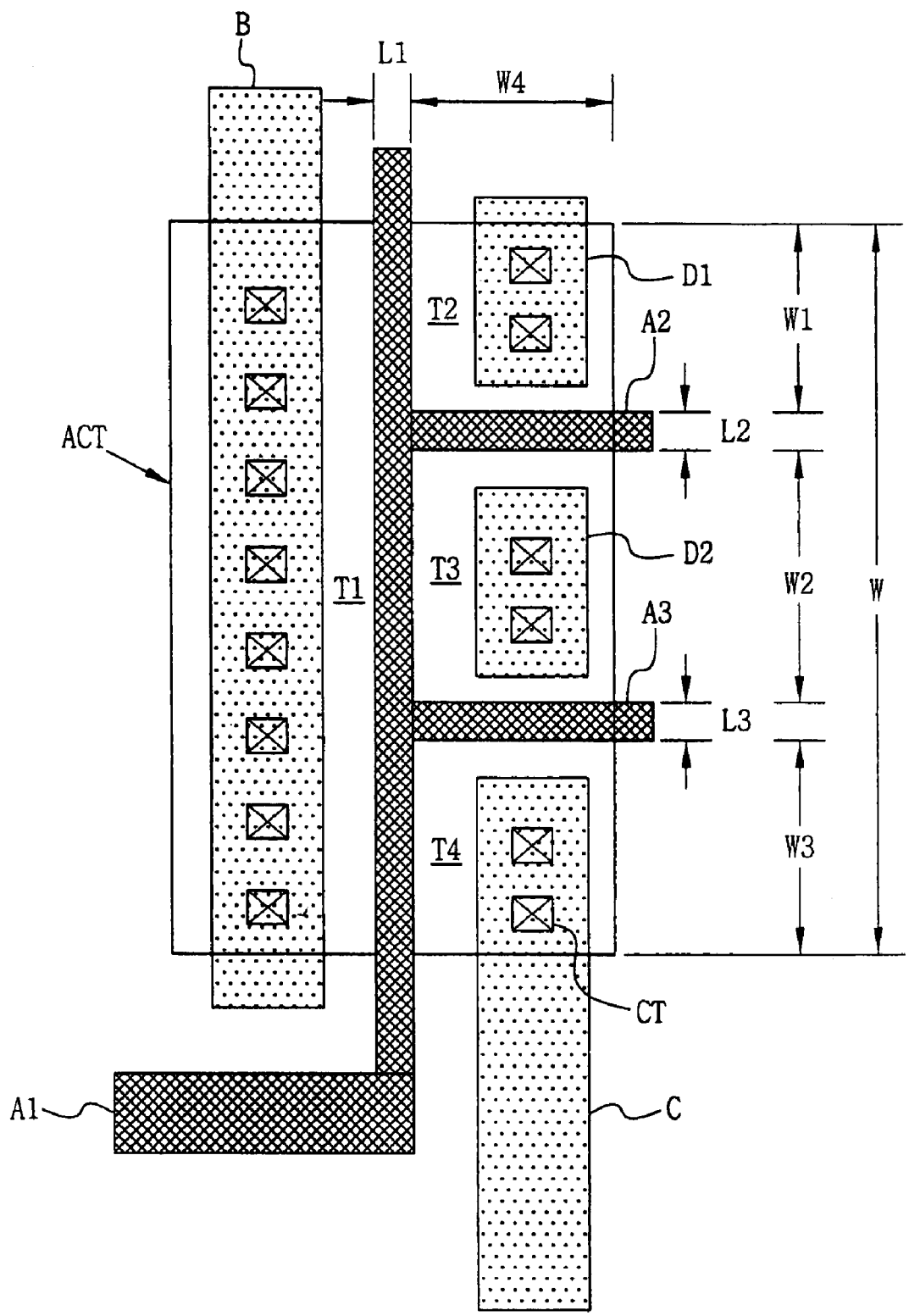
Figure 9:
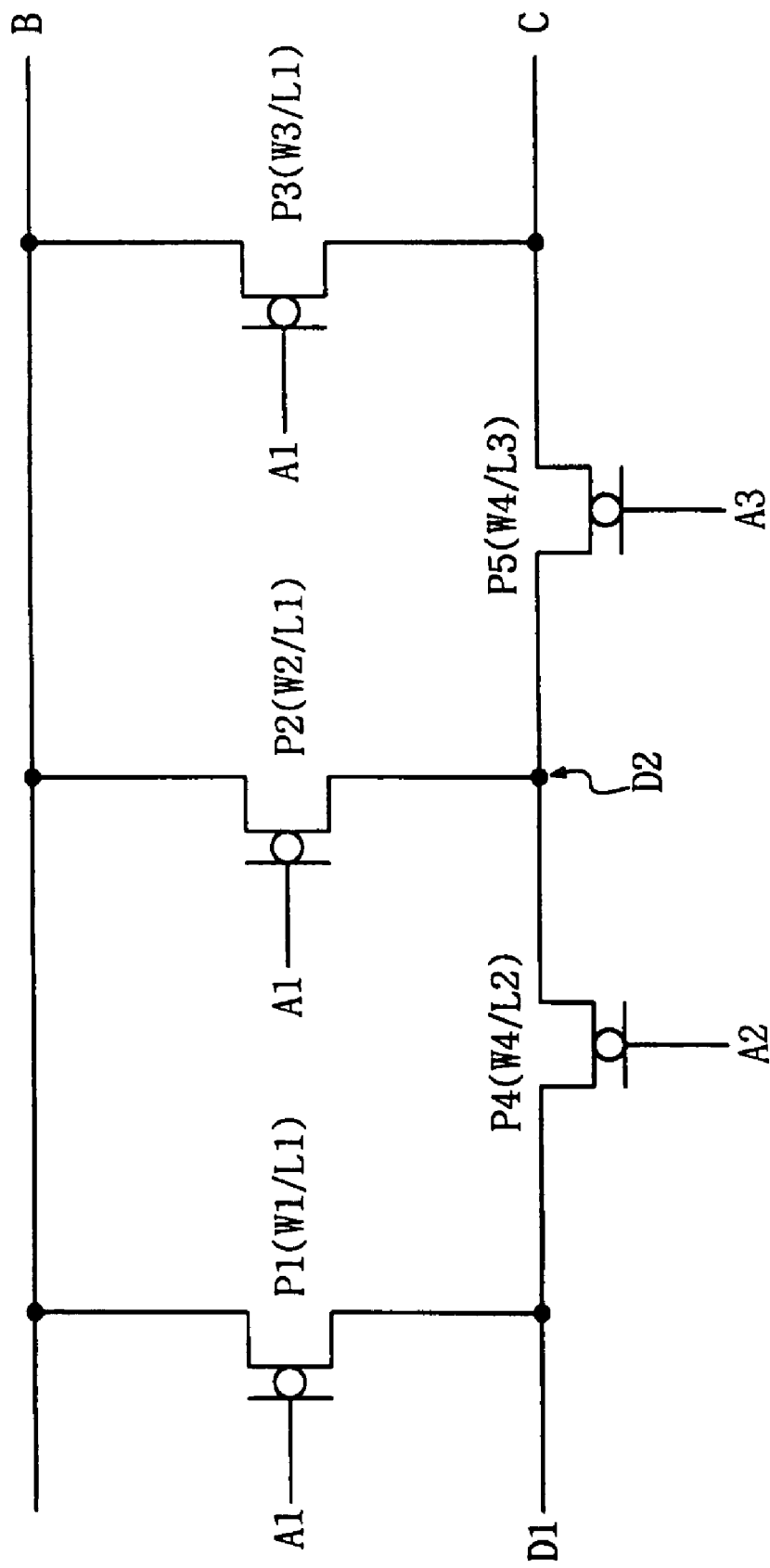
FIG. 9 is an equivalent circuit diagram of FIGS. 7 and 8.

FIGS. 7 and 8 are transistor layout diagrams according to example embodiments. FIG. 9 is an equivalent circuit diagram of FIGS. 7 and 8. In FIGS. 7 and 8, many more transistors than those of FIG. 3 or 5 may be arranged to make it easy to control the size of each transistor. FIG. 7 illustrates a layout structure that may differentiate the channel length of one or more transistors by differentiating the width and/or thickness of the gate lines arranged in the active region. FIG. 8 illustrates a layout structure that may differentiate the channel width of one or more transistors by differentiating the size of the divided active regions divided by the gate lines.

Although the terms and reference numerals used in FIGS. 7 through 9 may be similar to those used in FIGS. 3 through 6, these are for clarity in understanding FIGS. 7 through 9 in comparison with FIGS. 3 through 6. Therefore, it should be understood that the elements of FIGS. 7 through 9 may not necessarily be identical with those of FIGS. 3 through 6.

As illustrated in FIGS. 7 and 8, the transistors according to example embodiments may have a layout structure with an active region ACT, a first gate line A1, a second gate line A2, and/or a third gate line A3.

The active region ACT may be arranged in a size that may or may not be predetermined. The size of the active region ACT to be arranged may be a little bigger than the generally defined size for a transistor in the desired size to be manufactured.

The first gate line A1 may be arranged on the active region ACT in a first direction. The first gate line A1 may extend across all or a portion of the active region ACT. The first gate line A1 may divide the active region ACT into two divided active regions. The first gate line A1 may have a width L1 (that may or may not be predetermined).

The second gate line A2 with a width L2 (that may or may not be predetermined) may extend from a specific part of the first gate line A1 across a portion of the active region ACT in a second direction that is at an angle to the first direction. The first and second directions may be, for example, substantially perpendicular to each other.

The third gate line A3 with a width L3 (that may or may not be predetermined) may extend from a specific part of the first gate line A1 across a portion of the active region ACT in the second direction. That is, the second gate line A2 and third gate line A3 may be arranged to be spaced apart from each other, at a interval W2 (that may or may not be predetermined), and/or parallel to each other. At least two or more gate lines may be arranged substantially in the second direction, in contrast to FIG. 3.

The second gate line A2 and the third gate line A3 may divide one of the two divided regions (divided by the first gate line A1) into three regions T2, T3, and T4.

Therefore, the active region ACT may be divided by the first gate line A1, the second gate line A2, and/or the third gate line A3, resulting in a first divided active region T1, a second divided active region T2, a third divided active region T3, and/or a fourth divided active region T4.

Depending on the above-described layout structure, at least five transistors P1, P2, P3, P4, and P5 (that may be the same as or different from one another in size) may be arranged in the active region ACT. The divided active regions T1, T2, T3, and/or T4 may be included as common or independent source or drain regions in one or more of the transistors.

Among the five transistors P1, P2, P3, P4, and/or P5, the first transistor P1 may be arranged with the first divided active region T1 and the second divided active region T2 as source/drain regions, and/or with the first gate line A1 as a gate region. The channel width of the first transistor P1 may be 'W1', which may be the length of the second divided active region T2 in the first direction, and/or the channel length may be the width of the first gate line A1, that is, the length L1 of the first gate line A1 in the second direction.

Among the five transistors P1, P2, P3, P4, and/or P5, the second transistor P2 may be arranged with the first divided active region T1 and the third divided active region T3 as source/drain regions, and/or with the first gate line A1 as a gate region. The channel width of the second transistor P2 may be 'W2', which may be the length of the third divided active region T3 in the first direction, and/or the channel length may be the width of the first gate line A1, that is, the length L1 of the first gate line A1 in the second direction.

Among the five transistors P1, P2, P3, P4, and/or P5, the third transistor P3 may be arranged with the first divided active region T1 and the fourth divided active region T4 as source/drain regions, and/or with the first gate line A1 as a gate region. The channel width of the third transistor P3 may be 'W3', which may be the length of the fourth divided active region T4 in the first direction, and/or the channel length may be the width of the first gate line A1, that is, the length L1 of the first gate line A1 in the second direction.

Among the five transistors P1, P2, P3, P4, and/or P5, the fourth transistor P4 may be arranged with the second divided active region T2 and the third divided active region T3 as source/drain regions, and/or with the second gate line A2 as a gate region. The channel width of the fourth transistor P4 may be 'W4', which may be the length of the second divided active region T2 and/or the third divided active region T3, and/or the channel length may be the width of the second gate line A2, that is, the length L2 of the second gate line A2 in the first direction.

Among the five transistors P1, P2, P3, P4, and/or P5, the fifth transistor P5 may be arranged with the third divided active region T3 and the fourth divided active region T4 as source/drain regions, and/or with the third gate line A3 as a gate region. The channel width of the fifth transistor P5 may be 'W4', which may be the length of the third divided active region T3 and/or the fourth divided active region T4 in the second direction, and/or the channel length may be the width of the third gate line A3, that is, the length L3 of the third gate line A3 in the first direction.

Subsequently, the upper wires (for example, metal wires) B, D1, D2, and/or C, that may be respectively electrically connected to the divided active regions T1, T2, T3, and/or T4 through one or more contacts CT, may be arranged. As one of the upper wires, the first upper wire B may be electrically connected, for example, to the first divided active region T1. In addition or in the alternative, the first upper wire B may be electrically connected, for example, to a line for a source voltage VDD and/or a line for application of any control signal. Further, the second upper wire D1 may be electrically connected, for example, to the second divided active region T2 through the one or more contacts CT. The third upper wire D2 may be electrically connected, for example, to the third divided active region T3 through the one or more contacts CT. The fourth upper wire C may be electrically connected, for example, to the fourth divided active region T4 through the one or more contacts CT. In addition or in the alternative, the fourth upper wire C may be electrically connected, for example, to a ground line and/or a line for application of any control signal.

In this case, the transistors that are different from one another in size may be formed, for example, by selecting at least two of the first upper wire B, the second upper wire D1, the third upper wire D2, and the fourth upper wire C and electrically connecting the selected at least two upper wires to each other, using an additional fifth upper wire and/or an additional mask. For example, the first upper wire B may be electrically connected to the third upper wire D2, or the second upper wire D1, the third upper wire D2, and/or the fourth upper wire C may be electrically connected to one another, to control the size of one or more of the transistors.

As illustrated in FIGS. 7 and 8, the first divided active region T1, the second divided active region T2, the third divided active region T3, and/or the fourth divided active region T4 may be similar to or the same as one another in size, but also may be arranged to be different from one another. Further, the first gate line A1, the second gate line A2, and/or the third gate line A3 may be same as one another in width or thickness, but also may be arranged to be different from one another.

As illustrated in FIG. 9, the equivalent circuit diagram of the five transistors P1, P2, P3, P4, and/or P5 that may be arranged according to the layout structure of FIGS. 7 and 8 may be as discussed below.

The first transistor P1 may be electrically connected, for example, between the nodes B and D1; the second transistor P2 may be electrically connected, for example, between the nodes B and D2; the third transistor P3 may be electrically connected, for example, between the nodes B and C; the fourth transistor P4 may be electrically connected, for example, between the nodes D1 and D2; and/or the fifth transistor P5 may be electrically connected, for example, between the nodes D2 and C.

For example, when the second upper wire D1, the third upper wire D2, and/or the fourth upper wire C may be electrically connected to one another in FIGS. 7 and 8, that is, when the nodes D1, D2, and/or C may be shorted, the size of a synthetic transistor may be similar to that of FIGS. 5 and/or 6.

As described above, unlike the conventional art, any one active region may be divided into at least three divided active regions, so that a plurality of transistors may be arranged. Therefore, the size of one or more transistors may be controllable by revision at the upper wiring step and/or subsequent steps. Consequently, the manufacturing cost may be reduced and/or the efficiency of production may be improved. Furthermore, the size of the one or more transistors may be controlled without changing the size of the active region.

Example embodiments illustrate and/or describe the layout structure of PMOS transistors. However, this disclosure is applicable to any other transistors, including NMOS transistors.

While example embodiments have been particularly shown and described, it will be understood by those of ordinary skill in the art that various changes in form and details may be made therein without departing from the spirit and scope of the present invention as defined by the following claims.

What is claimed is:

1. A transistor layout structure for controlling a size of one or more transistors, comprising:
    the one or more transistors;
    an active region;
    a first gate line on the active region arranged substantially in a first direction;
    one or more second gate lines on the active region arranged to extend substantially in a second direction from the first gate line; and
    source or drain regions arranged in three or more of a plurality of divided active regions that result from the first gate line and the one or more second gate lines dividing the active region into the plurality of divided active regions;
    wherein the second direction is at an angle to the first direction, and
    wherein at least one of the one or more transistors includes a first of the divided active regions as a source region and a second of the divided active regions as a drain region.

2. The structure of claim 1, wherein the second direction is substantially perpendicular to the first direction.

3. The structure of claim 1, further comprising:
    two or more upper wires;
    wherein the size of the one or more transistors is controllable by connecting to each other or separating from each other all or part of the two or more upper wires, and
    wherein each upper wire is connected to a respective divided active region through one or more contacts.

4. The structure of claim 3, wherein the upper wires are metal wires.

5. The structure of claim 1, wherein a channel width of the one or more transistors is controlled by controlling:
    an arrangement of the first gate line; and
    a length of the one or more second gate lines.

6. The structure of claim 1, wherein a channel length of the one or more transistors is controlled by controlling a width of the first gate line, a width or widths of the one or more second gate lines, or a width or widths of the first gate line and the one or more second gate lines.

7. The structure of claim 1, wherein the first gate line has a first width in the first direction, and
    wherein the one or more second gate lines have one or more second widths in the second direction.

8. The structure of claim 7, further comprising:
    two or more upper wires;
    wherein the size of the one or more transistors is controllable by connecting to each other or separating from each other all or part of the two or more upper wires, and
    wherein each upper wire is connected to a respective source or drain region through one or more contacts.

9. The structure of claim 8, wherein the upper wires are metal wires.

10. The structure of claim 7, further comprising:
    two or more second gate lines;
    wherein the two or more second gate lines are arranged to be substantially parallel to each other, and
    wherein the two or more second gate lines are spaced apart from each other.

11. The structure of claim 7, wherein the channel width of the one or more transistors is controlled by controlling:
    an arrangement of the first gate line; and
    a length of the one or more second gate lines.

12. The structure of claim 7, wherein the channel length of the one or more transistors is controlled by controlling a width of the first gate line, a width or widths of the one or more second gate lines, or a width or widths of the first gate line and the one or more second gate lines.

13. A transistor layout structure for controlling a size of one or more transistors, comprising:
    the one or more transistors;
    an active region; and
    two or more gate lines on the active region extending from each other in different directions;
    wherein the two or more gate lines divide the active region into three or more divided active regions, wherein a size of the one or more transistors is controlled by connecting to each other or separating from each other the divided active regions using upper wires, and wherein at least one of the one or more transistors includes a first of the divided active regions as a source region and a second of the divided active regions as a drain region.

14. The structure of claim 13, wherein a channel length, a channel width, or a channel length and a channel width of the one or more transistors are controlled by controlling a length or lengths, a width or widths, or a length or lengths and a width or widths of the two or more gate lines.

15. A method of controlling a size of one or more transistors in a transistor layout structure, comprising:

the one or more transistors;

arranging an active region;

arranging a first gate line on the active region substantially in a first direction;

arranging one or more second gate lines on the active region to extend substantially in a second direction from the first gate line;

arranging source or drain regions in three or more of a plurality of divided active regions that result from the first gate line and the one or more second gate lines dividing the active region into the plurality of divided active regions; and controlling the size of the one or more transistors by connecting to each other or separating from each other the source or drain regions using upper wires;

wherein the second direction is at an angle to the first direction, and wherein at least one of the one or more transistors includes one of the source or drain regions as a first source region and another of the source or drain regions as a first drain region.

16. The method of claim 15, wherein the upper wires are metal wires that are connected to the source or drain regions through one or more contacts.

17. The method of claim 15, wherein arranging the first gate line comprises:

controlling a channel width of the one or more transistors by controlling the arrangement of the first gate line and controlling a length or lengths of the one or more second gate lines.

18. The method of claim 15, wherein arranging the first gate line and the one or more second gate lines comprises:

controlling a channel length of the one or more transistors by controlling a width of the first gate line, a width or widths of the one or more second gate lines, or a width or widths of the first gate line and the one or more second gate lines.

19. The method of claim 15, further comprising:

arranging two or more second gate lines on the active region to extend substantially in the second direction from the first gate line;

wherein the two or more second gate lines are arranged to be substantially parallel to each other, and wherein the two or more second gate lines are arranged to be spaced apart from each other.

20. A method of controlling a size of one or more transistors in a transistor layout structure, comprising:

forming at least three or more transistors by dividing one active region into three or more divided regions;

selecting at least two of the three or more divided regions in an upper wire forming step; and electrically connecting to each other or separating from each other the at least two selected divided regions;

wherein at least one of the three or more transistors includes a first of the divided regions as a source region and a second of the divided regions as a drain region.

* * * * *